United States Patent

[11] 3,612,901

[72] Inventor James M. Loe
Willow Grove, Pa.
[21] Appl. No. 888,430
[22] Filed Dec. 29, 1969
[45] Patented Oct. 12, 1971
[73] Assignee Philco-Ford Corporation
Philadelphia, Pa.

[54] PULSE GENERATOR HAVING CONTROLLABLE DUTY CYCLE
10 Claims, 2 Drawing Figs.

[52] U.S. Cl. .......... 307/106, 307/265, 328/58, 330/107
[51] Int. Cl. .......... H03k 3/64
[50] Field of Search .......... 307/106, 265, 266, 267; 328/58, 67; 330/107

[56] References Cited

UNITED STATES PATENTS

| | | | |
|---|---|---|---|
| 1,442,781 | 1/1923 | Nichols | 330/107 X |
| 2,024,489 | 12/1935 | Van Der Pol et al. | 330/107 X |
| 2,629,025 | 2/1953 | Roberts | 330/107 X |
| 2,811,591 | 10/1957 | Kennedy | 330/107 |
| 3,509,482 | 4/1970 | Guillemin | 330/107 |

FOREIGN PATENTS

| | | | |
|---|---|---|---|
| 1,163,037 | 2/1964 | Germany | 330/107 |

*Primary Examiner*—William M. Shoop, Jr.
*Attorney*—Herbert Epstein

ABSTRACT: A pulse generator responsive to a single input signal for producing a fixed frequency pulse output signal, the duty cycle (pulse width) of which is proportional, at any instant, to the amplitude of said input (modulating) signal. The generator comprises a high gain inverting amplifier whose output is connected to its input via three phase shifting stages, each comprising a series resistor and a shunt capacitor. The modulating signal is applied to the input of the amplifier via an isolating resistor. In absence of a modulating signal, the generator oscillates at a fixed frequency, producing an output pulse train having a 50 percent duty cycle. The modulating signal changes this duty cycle by (1) opposing the discharge of the shunt capacitor of the third delay stage when said capacitor is charged in one direction, and (2) aiding its discharge when it is charged in the opposite direction.

PULSE GENERATOR HAVING CONTROLLABLE DUTY CYCLE

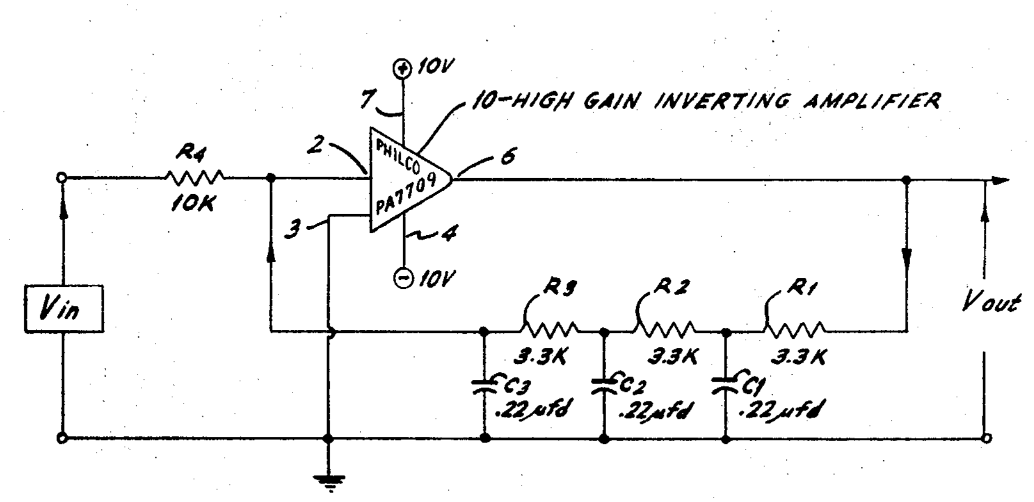
FIG. 1. PULSE GENERATOR HAVING CONTROLLABLE DUTY CYCLE
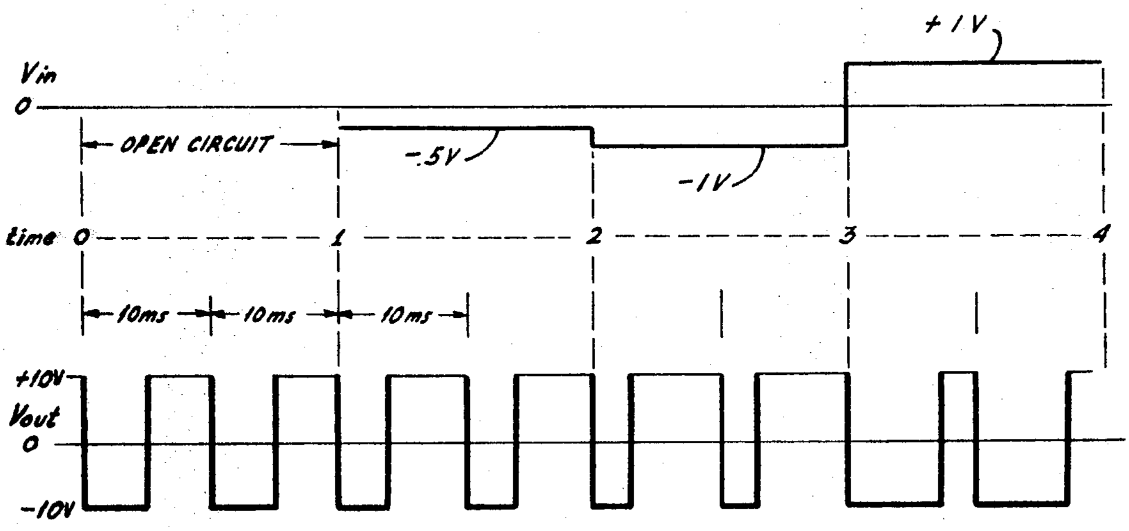
FIG. 2. WAVEFORMS RE FIG. 1.
INVENTOR.
JAMES M. LOE
D R Pressman
ATTORNEY

PULSE GENERATOR HAVING CONTROLLABLE DUTY CYCLE

BACKGROUND OF THE INVENTION

The present invention is a pulse generator which produces an output signal consisting of a train of pulses having a fixed pulse repetition frequency wherein each pulse has a width or duty cycle proportional to the amplitude of a modulating signal.

A pulse generator having a controllable duty cycle, i.e. a generator for producing periodic pulses whose duty cycle is controllable by a modulating signal supplied to the input of the generator, has utility in many applications. For example in some control systems 37½ it is necessary to control the dwell time of an electromagnetically driven reciprocating valve in accordance with the amplitude of a direct current (DC) voltage, such a pulse generator may be used to drive the valve's control coil in response to said DC voltage. Such a control system is shown as part of an electronic device for maintaining vehicle speed in U.S. Pat. 3,388,764, of R. F. Wood, issued June 18, 1968 to Philco-Ford Corp., the present pulse generator may be used in lieu of element 88 of FIG. 1 of the system of said patent.

Another use for the present pulse generator is in applications where a magnetic recording of a DC voltage must be made. Since it is impractical to record a DC voltage, the present pulse generator may be used to generate, in response to the DC voltage, a pulse width modulated signal which can be recorded easily and also demodulated easily by a low-pass filter.

The main disadvantage of prior art pulse generators having a controllable duty cycle, which is avoided by the present invention, is complexity. In relation to prior art pulse generators of similar function, the present is an extremely simple circuit which has concomitant high reliability, low cost, compactness, and light weight. In addition the present pulse generator is responsive to bipolar input signals. Also, it is capable of generating an output signal whose frequency and amplitudes are relatively invariant as its duty cycle is altered. Moreover, the present circuit can easily be designed accurately in advance to provide an output signal of any given frequency without the requirement for empirical correction.

Accordingly several objects of the present invention are to provide a pulse generator having a controllable duty cycle which: (1) is extremely simple and hence has high reliability, compactness, low cost, and light weight, (2) produces an output signal whose frequency and amplitude are highly invariant as its duty cycle is altered, (3) is responsive to bipolar input signals, and (4) can easily be designed accurately in advanced to provide an output signal of any given frequency. Other objects and advantages of the invention will become apparent from a consideration of the ensuing description thereof.

BRIEF DESCRIPTION OF THE DRAWING

FIG. 1 shows a schematic diagram of a pulse generator having a controllable duty cycle in accordance with the present invention.

FIG. 2 shows a diagram of voltage waveforms associated with the circuits of FIG. 1.

DESCRIPTION OF THE PREFERRED EMBODIMENT

Function of Circuit

The pulse generator of the invention (FIG. 1) functions to produce, in response to the modulating signal shown in FIG. 2 at $V_{in}$, the output signal shown in FIG. 2 at $V_{out}$.

When $V_{in}$ is absent, as from time 0 ($T_O$) to time 1 ($T_1$), the generator's output will be a series of negative-going pulses as indicated in the $V_{out}$ signal from $T_0$ to $T_1$. The pulses, which go from +10 volts (+10 v.) to −10 volts (−10 v.), are shown in heavy lines for clarity. From $T_0$ to $T_1$, the temporal width of each pulse is equal to 50 percent of the temporal width of each cycle of the $V_{out}$ signal, wherein a cycle, indicated by the "10 msec." (10 milliseconds) legends, consists of a pulse and the interval from the end of said pulse to the beginning of the next pulse. Hence $V_{out}$ from $T_0$ to $T_1$ is said to have a duty cycle of 50 percent.

When $V_{in}$ is negative, say at −.5 v. as shown from $T_1$ to $T_2$, the width of each pulse narrows such that the duty cycle of $V_{out}$ decreases to about 37½ percent as indicated.

When the input signal becomes even more negative, say −1v. as shown from $T_2$ to $T_3$, the duty cycle of $V_{out}$ decreases to about 25 percent, as indicated.

On the other hand, when $V_{in}$ is positive, say +1v. as shown from T3 to T4, the duty cycle of $V_{out}$ increases to about 75 percent, as indicated.

If $V_{in}$ varies continuously, rather than assuming the constant levels shown, the duty cycle of $V_{out}$ also varies continuously in accordance with $V_{in}$ in a manner well known to those skilled in the art.

As also well known to those skilled in the art, the $V_{out}$ signal can easily be converted into a signal having the form of the $V_{in}$ signal by translating $V_{out}$ through a low-pass filter.

It should be noted that while the duty cycle of $V_{out}$ varies in accordance with the amplitude of $V_{in}$, neither the amplitude of $V_{out}$ nor its pulse repetition frequency varies. Thus the leading (negative going) edges of the $V_{out}$ pulses occur periodically, as indicated by the 10 msec. legends above the first three cycles of $V_{out}$.

Description of Circuit

The circuit of FIG. 1 includes a high gain inverting amplifier 10, for resistors R1, R2, R3, and R4, and three capacitors C1, C2, and C3.

Amplifier 10 preferably comprises a differential DC (direct current) integrated circuit amplifier of the make and type indicated, which can supply at its terminal 6 an output signal which has (1) a polarity opposite that of an input signal supplied to its input terminal 2 (2) an amplitude proportional to the magnitude of the input signal when the input signal has a magnitude within a given range, and (3) a maximum amplitude independent of the magnitude of the input signal when that magnitude lies outside the given range. Terminal 3, another input terminal of the differential amplifier, is connected to a reference potential point. Thus when a small positive input voltage is applied to terminal 2, a large negative output voltage will be supplied at terminal 6, and when a small negative input voltage is applied to terminal 2, a large positive output voltage will be supplied at terminal 6. The voltage gain of amplifier 10 preferably is about 45,000 for input voltages of amplitudes between about −0.3 millivolt (−0.3 mv.) and +0.3 millivolt (+0.3 mv), and is in saturation for input signals having an amplitude in excess of said range. However amplifiers with voltage gains as low as 3,000 are tolerable. The particular integrated circuit indicated requires positive and negative bias voltage supplies of the amplitude indicated connected to its terminals 7 and 4, respectively.

Output terminal 6 of amplifier 10 is connected to input terminal 2 thereof via a feedback circuit consisting of a three stage phase shifting or delay circuit, each stage of which comprises a series resistor followed by a shunt capacitor. Preferably the resistors R1, R2, and R3 in the phase shifting circuit have equal values, as do shunt capacitors C1, C2, and C3. Resistors R1, R2, and R3 are connected in a series string between output terminal 6 and input terminal 2 of amplifier 10 and each of capacitors C1, C2, and C3 is connected between the left-hand terminal of one of the resistors and reference terminal 3.

An input signal source, represented by the block labeled $V_{in}$, is coupled to ground and to input terminal 2 of amplifier 10 via an isolating resistor R4. R4 is provided to allow the potential of terminal 2 to be urged toward the potential of $V_{in}$ while allowing the potential of terminal 2 to be varied by the feedback signal from the feedback circuit to values other than the potential of $V_{in}$.

An output signal from the pulse generator is taken between terminal 6 of amplifier 10 and the reference potential point.

Operation of Circuit

In general, the pulse generator of FIG. 1 operates, in absence of an input signal from $V_{in}$, as a phase shift oscillator, producing the 50 percent duty cycle output signal shown at $V_{out}$ in FIG. 2 from $T_0$ to $T_1$. Application of an input signal from the $V_{in}$ source makes the bipolar charge/discharge cycles of C3 asymmetrical. Since the voltage across C3 is the input voltage to which amplifier 10 responds, such asymmetry causes the duty cycle of $V_{out}$ to either decrease of increase from the 50 percent value, depending on the polarity of $V_{in}$.

In particular, in absence of an input signal from the $V_{in}$ source ($V_{in}$ open circuited), when bias potential is first applied to amplifier 10, noise signals of all frequencies will be present at the input of amplifier 10. Such noise signals, will be amplified in amplifier and fed back by the phase shift circuit to the input of amplifier 10. Noise of one particular frequency (in the present case 1 kHz. will be phase shifted one full cycle or 360° by the circuit consisting of amplifier 10 and the feedback circuit. Hence noise of this frequency will be fed back in phase with itself at the input of amplifier 10, and will be reamplified, causing amplifier 10 and the feedback circuit to act as a phase shift oscillator, producing a 1 kHz. output signal. An example of a phase shift oscillator may be found in FIG. 1 of U.S. Pat. No. 1,442,781 to H. W. Nichols, granted Jan. 16, 1923. As shown in FIG. 2 of applicant's drawings from $T_0$ to $T_1$, $V_{out}$ has a polarity-symmetrical waveform and a 50 percent duty cycle. Also, $V_{out}$ is a square or pulsed waveform since amplifier 10 always operates in either positive or negative saturation, except for brief intervals during its transition from +10 v. to −10 v. or vice versa.

As thus far described, the operation of the circuit causes C3 periodically to charge and discharge in a bipolar, symmetrical fashion at the pulse repetition frequency of $V_{out}$, as is well understood by those skilled in the art. That is, the feedback signal supplied from output terminal 6 of amplifier 10 causes C3 to charge and discharge so that its upper terminal alternately is positive and negative. When C3 is charged so that its upper terminal (terminal 2 of amplifier 10) is positive, $V_{out}$ will be at a negative voltage (−10 v.) due to the polarity reversal provided by amplifier 10. Similarly when C3 is charged negatively so that terminal 2 of amplifier 10 is negative, $V_{out}$ will be at a positive voltage (+10 v.).

Now assume that $V_{in}$ is negative, as indicated from $T_1$ to $T_2$. The negative voltage supplied by $V_{in}$ tends to charge C3 negatively via R4, thereby (1) opposing the feedback signal when it tends to change the voltage on C3 from negative to positive, and (2) aiding the feedback signal when it tends to change the voltage on C3 from positive to negative. Thus $V_{in}$, when negative, will increase the proportion of cycle time when C3 is charged negatively and decrease the proportion of cycle time when C3 is charged positively. Since the voltage across C3 is the input signal to which amplifier 10 responds, $V_{out}$, which is the polarity-inverse of the voltage on C3, will be positive a greater proportion of time of each cycle than it will be negative, as indicated from $T_1$ to $T_2$. As $V_{in}$ becomes more negative ($T_2$ to $T_3$), $V_{out}$ becomes positive a greater proportion of time, as indicated.

Conversely, when $V_{in}$ is positive ($T_3$ to $T_4$), the proportion of time during which C3 is charged positively will be increased and the proportion of time during which C3 is charged negatively will be decreased, thereby causing $V_{out}$ to be negative a greater proportion of time than it is positive, as indicated.

MODIFICATIONS

The specificities of the above description should not be considered as limitations of the scope of the invention since many modifications thereof are possible. For example, an inverting amplifier operating with a single bias source can be used if a unipolar output signal is desired. In addition if one desires to use an inverting amplifier which operates from a single bias source and still produce a bipolar output signal, a DC-blocking capacitor can be connected in series with the output terminal of the pulse generator in order to convert the unipolar output of the single bias source amplifier to a bipolar signal.

The isolating resistor R4 can be eliminated if the $V_{in}$ source has a sufficiently high internal impedance to provide the requisite isolation.

With a feedback circuit having components of the values shown, the frequency of $V_{out}$ will be 1 kHz. Other pulse repetition frequencies can be obtained by suitable choice of values for R1 to R3 and C1 to C3, as is well known by those skilled in the art.

While a three stage RC circuit has been illustrated for use as a feedback delay circuit, any other type of delay means which provides DC coupling may be used in lieu thereof. Also the series feedback resistors R1, R2, and R3 may be replaced with other suitable isolating impedances, such as inductors.

Further, while three phase shifting stages have been indicated, more may be used if desired. Fewer than three stages can also be used if additional phase shift (more than 180°) is provided in amplifier 10 or in a separate phase shifter. For example, with the three stages shown it is assumed that substantially no phase shift beyond 180° is provided in amplifier 10 and that each of the three RC phase shifting stages shown provides a phase shift of 60°. However if two phase shift stages are desired, additional phase shift must be provided in amplifier 10 or elsewhere in the feedback circuit. Otherwise, the circuit will be inoperative as each RC stage would have to provide a 90° phase shift, thereby providing infinite attenuation and preventing any feedback signal from being transmitted.

The input signal source $V_{in}$ can be arranged to supply either a unipolar or a bipolar input signal. The maximum frequency of $V_{in}$ preferably should be substantially less than the operating frequency of the modulator.

If one desires that, in absence of $V_{in}$, $V_{out}$ have an asymmetric form, i.e., a duty cycle other than 50 percent, a fixed bias source the desired polarity can be connected to terminal 2 via an isolating resistor.

I claim:

1. A generator for producing periodic pulses having a duty cycle dependent on the value of a modulating signal supplied to said generator, comprising:

a. means having an input terminal, an output terminal, and a reference terminal, for producing between said output terminal and said reference terminal, in response to an input voltage applied between said input terminal and said reference terminal, an output voltage which has
   i. a polarity opposite that of said input voltage, and
   ii. an amplitude directly dependent on the value of said input voltage when said value lies within a given range bounded by a first voltage and a second voltage more positive than said first voltage, and
   iii. when said input voltage is less positive than said first voltage, a first fixed amplitude independent of said input voltage, and
   iv. when said input voltage is more positive than said second voltage, a second fixed amplitude independent of said input voltage, b. means for feeding back a portion of said output voltage from said output terminal to said input terminal, for providing 180° or phase shift at a particular frequency and for providing direct-current coupling from said output terminal to said input terminal, said means for producing said output voltage having a voltage gain, when said input voltage has a value within said given range, sufficiently high to cause said output voltage to change, in response to said fed-back portion of said output voltage, periodically and abruptly at said particular frequency between said first fixed amplitude and said second fixed amplitude, so that said generator produces a pulsiform output signal having a repetition rate equal to said particular frequency and a given duty cycle, and c. means for applying a modulating voltage between said input and reference terminals and for combining said applied modulating voltage with said portion of said output voltage fed back to said input terminal, thereby to produce variations in the duty cycle of said output signal in accordance with variations in said modulating voltage.

2. A pulse generator according to claim 1, wherein said means for feeding back a portion of said output voltage comprises at least three phase-shifting stages connected in cascade from said output and reference terminals to said input and reference terminals, each of said stages comprising a series resistor and a shunt capacitor.

3. A pulse generator according to claim 1, wherein said means for applying and combining said modulating voltage comprises a resistor having one terminal connected to said input terminal of said means for producing said output voltage and having another terminal for receiving said modulating voltage.

4. A pulse generator according to claim 3, additionally comprising a source of modulating voltage, said source having one terminal connected to said reference terminal and another terminal connected to said terminal for receiving said modulating voltage.

5. A pulse generator according to claim 1 wherein said means for producing said output voltage has a voltage gain of at least three thousand, when said input voltage has a value within said given range.

6. A pulse generator according to claim 1, wherein said first voltage is negative by a given amount with respect to the potential of said reference terminal, said second voltage is positive by substantially said given amount with respect to said reference terminal potential, said first fixed amplitude is positive by a given quantity with respect to said reference terminal potential, said second fixed amplitude is negative by substantially said given quantity with respect to said reference terminal potential, and said voltage gain of said means for producing said output signal is substantially constant for input voltages between said first voltage and said second voltage.

7. A pulse generator according to claim 6, wherein said means for feeding back a portion of said output voltage comprises at least three phase-shifting stages connected in cascade from said output and reference terminals to said input and reference terminals, each of said stages comprising a series resistor and a shunt capacitor.

8. A pulse generator according to claim 7, wherein said means for producing said output voltage has a voltage gain, for input voltages between said first and second voltages, of at least three thousand.

9. A pulse generator according to claim 8 wherein said means for applying and combining said modulating voltage comprises a resistor having one terminal connected to said input terminal of said means for producing said output voltage and having another terminal for receiving said modulating voltage.

10. A pulse generator according to claim 9, additionally comprising a source of a modulating voltage, said source having one terminal connected to said reference terminal and another terminal connected to said terminal for receiving said modulating voltage.